United States Patent [19]

Hara

[11] Patent Number: 4,933,627
[45] Date of Patent: Jun. 12, 1990

[54] CONSTANT VOLTAGE GENERATING CIRCUIT FOR SELECTIVELY GENERATING A CONSTANT VOLTAGE AT A HIGH-SPEED

[75] Inventor: Yoshiko Hara, Tokyo, Japan
[73] Assignee: NEC Corporation, Tokyo, Japan
[21] Appl. No.: 390,002
[22] Filed: Aug. 7, 1989

[30] Foreign Application Priority Data

Aug. 7, 1988 [JP] Japan .................................. 63-196910

[51] Int. Cl.$^5$ ............................................... G05F 3/24
[52] U.S. Cl. .................................. 323/313; 307/296.8; 365/226
[58] Field of Search ................. 365/183, 226; 323/312, 323/313, 314; 307/296.5, 296.8

[56] References Cited

U.S. PATENT DOCUMENTS

| | | | |
|---|---|---|---|
| 4,634,894 | 1/1987 | Shu et al. ........................... | 307/296.8 |
| 4,857,770 | 8/1989 | Partovi et al. ..................... | 307/296.8 |

Primary Examiner—William H. Beha, Jr.
Attorney, Agent, or Firm—Sughrue, Mion, Zinn, Macpeak & Seas

[57] ABSTRACT

A constant voltage generating circuit for controllably generating a constant voltage at a high speed in response to a control signal and operable with a small power consumption is disclosed. The constant voltage generating circuit comprises first and second output field effect transistors connected in series between first and second voltage terminals, a bias circuit having a series circuit of impedance elements and at least one switch element connected in series between the first and second voltage terminals, first and second intermediate nodes of the series circuit being connected to the gates of the first and second transistors respectively, the switch element taking a conductive state in response to a first level of the control signal a non-conductive state in response to a second level of the control signal, first and second capacitors, a first control circuit for charging the first and second capaitors in response to the second level of the control signal, and a second control circuit for applying electric charges stored in the first and second capacitors to the first and second intermediate nodes in response to the first level of the control signal.

7 Claims, 6 Drawing Sheets

CONSTANT VOLTAGE GENERATING CIRCUIT FOR SELECTIVELY GENERATING A CONSTANT VOLTAGE AT A HIGH-SPEED

BACKGROUND OF THE INVENTION

1. Field of the Invention

The present invention relates to a constant voltage generating circuit for selectively generating a constant voltage, and more particularly to a constant voltage generating circuit for quickly generating a constant voltage upon request thereof.

2. Description of the Related Art

Constant voltage generating circuits have been widely used for generating constant voltages which are usually utilized as a reference voltages in various fields. For example, in a dynamic memory device, a constant voltage generating circuit is employed for generating a reference voltage used for precharging bit lines. Namely, in a dynamic memory device employing a one-transistor type memory cell, each pair of bit lines are precharged to a reference voltage having an intermediate level of the logic "1" and "0" levels prior to a read operation. A read-out signal from a selected memory cell is applied to one of a pair of bit lines to compare its potential with the reference voltage precharged to the other bit line of the same pair for determining a logic level of the read-out signal. Since the constant voltage generated by the generating circuit is not continuously utilized but is used for only a predetermined period. Therefore, such a constant voltage generating circuit that produces a constant voltage in a controlled manner when the output of the constant voltage is necessary.

A conventional constant voltage circuit of this type is constructed by an output series circuit having a first field effect transistor connected between a first voltage terminal and an output terminal and a second field effect transistor connected between the output terminal and a second voltage terminal and a control circuit for rendering the first and second transistors conductive thereby to produce a constant voltage at the output terminal in a first mode and non-conductive to set the output terminal at a high impedance state in a second mode. The control circuit includes resistors, field effect transistors and switch elements connected in series between the first an second voltage terminals. The switch elements are made conductive in the first mode so that a DC current flows through the control circuit to bias the gates of the first and second transistors, while the switch elements are made non-conductive in the second mode to disenable the bias circuit so that the gates of the first and second transistors are set at inactive levels. When the constant voltage generating circuit switched from the second mode to the first mode, the gates of the first and second transistors are charged to their predetermined bias voltages through the resistors of the control circuit. However, in order to reduce a power consumption due to a current flowing through the bias circuit, the values of the resistors of the control circuit are made large. It requires a relatively large time to precharge the gates of the first and second transistors after the transistion from the second mode to the first mode. Accordingly, the conventional constant voltage generating circuit has a long response time to generate the constant voltage.

SUMMARY OF THE INVENTION

It is an object of the present invention to provide a constant voltage generating circuit which can produce a constant voltage output at a high speed upon request therefor.

It is another object of the present invention to provide a constant voltage generating circuit operable with a low power consumption.

The constant voltage generating circuit according to the present invention comprises first and second voltage terminals receiving first and second voltages, respectively; an output terminal; a first field effect transistor having a source-drain path connected between the first voltage terminal and the output terminal and a gate coupled to a first node; a first series circuit having a first resistor and a first switch element connected in series between the first voltage terminal and the first node; an impedance circuit coupled between the first node and the second voltage terminal; means for receiving a control signal assuming one of first and second levels, a first control circuit coupled to the first switch element for rendering the first switch element conductive thereby to generate a first bias voltage at the first node by causing a current flowing through the first series circuit and the impedance circuit in response to the first level of the control signal and non-conductive in response to the second level of the control signal, the first transistor being rendered conductive in response to the first bias voltage at the first node thereby to generate a constant voltage at the output terminal; a second control circuit coupled to the first node for operatively setting the first node at a second bias voltage in response to the second level of the control signal, the first transistor being rendered non-conductive i response to the second bias voltage at the first node; first and second capacitors each having first and second ends; means for connecting the second end of the first capacitor to one of the first and second voltage terminals; means for connecting the second end of the second capacitor to one of the first and second voltage terminals; a first charge circuit coupled to the first capacitor for operatively charging the first end of the first capacitor to the second voltage in response to the second level of the control signal; a second charge circuit coupled to the second capacitor for operatively charging the first end of the second capacitor to the first voltage in response to the second level of the control signal; a first charge control circuit for operatively short-circuiting the first ends of the first and second capacitors thereby to generate a first equilibrium voltage having a value close to the first bias voltage in response to the first level of the control signal; and means for applying the first equilibrium voltage to the first node.

According to the present invention, the first and second capacitors are charged during a stand-by period when the control signal is at the low level and the equilibrium voltage having the value close to the first bias voltage is generated by short-circuiting the first and second capacitor and applied to the first node as soon as the generating circuit is enabled in response to the first level of the control signal. Accordingly, the first node can be set at the first bias voltage at a high speed by way of the first and second capacitors in response to the first level of the control signal, even though the value of the first resistor is large.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
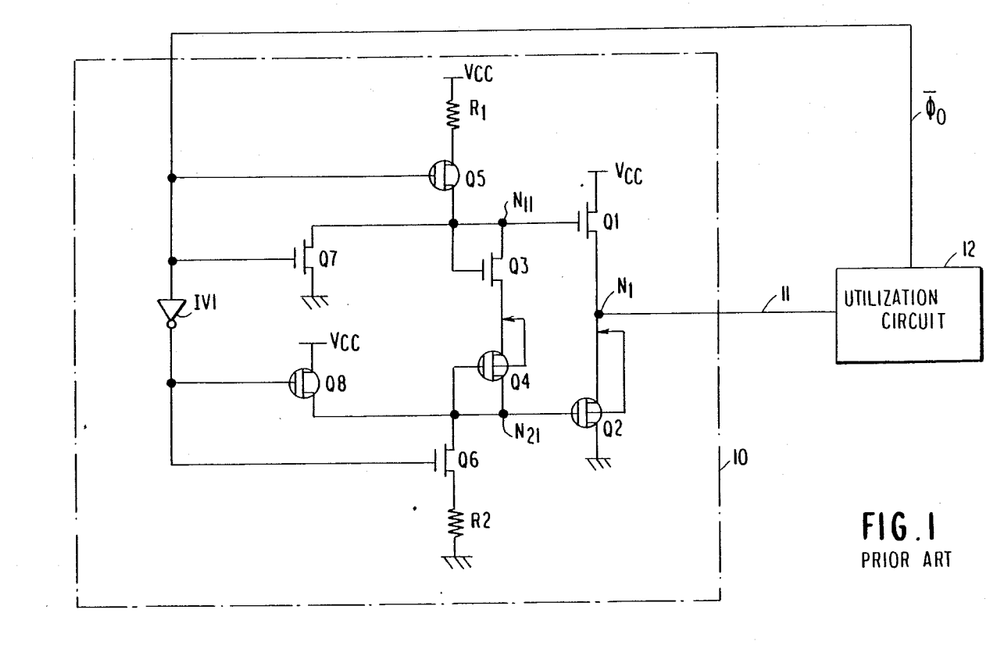
FIG. 1 is a schematic circuit diagram showing a constant voltage generating circuit in the prior art.
Figure 2:
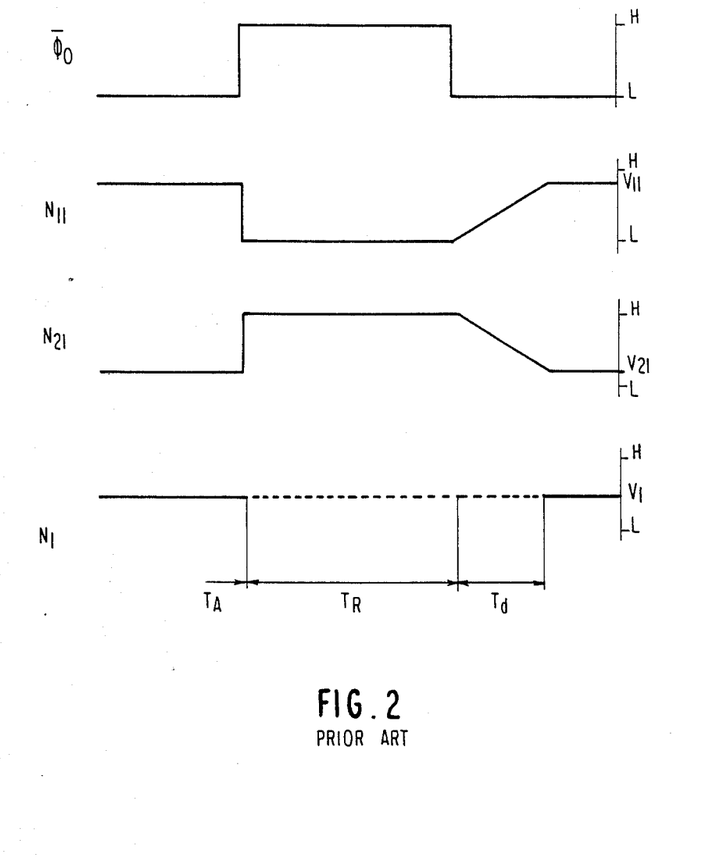
FIG. 2 is a timing chart showing the operation of the circuit of FIG. 1.

With reference to FIGS. 1 and 2, the constant voltage generating circuit in the prior art will be explained below.

The constant voltage generating circuit 10 comprises an output stage having an N-channel MOS transistor (NMOST) $Q_1$ and a P-channel MOS transistor (PMOST) $Q_2$ connected in series between a power voltage terminal Vcc and a ground voltage terminal (GND), and a bias circuit including a series circuit of a resistor $R_1$, a PMOST $Q_5$, a NMOST $Q_3$, a PMOST $Q_4$, an NMOST $Q_6$ and a resistor $R_2$ connected in series between Vcc and GND and a control circuit having an inverter $IV_1$ receiving a request signal $\overline{\phi_0}$ generated from an utilization circuit 12 using the constant voltage output $N_1$ through an output line 11, a reset NMOS $Q_7$ and a reset PMOST $Q_8$. The utilization circuit 12 generates a low (L) level of the request signal $\overline{\phi_0}$ when it requests the circuit 10 to output the constant voltage output $V_1$, and a high (H) level of $\overline{\phi_0}$ otherwise.

Operation of the circuit of FIG. 1 will be described in conjunction with the waveform diagram of FIG. 2. First, so far as $\overline{\phi_0}$ stays at the L level during an active period TA, the PMOST $Q_5$ and the NMOST $Q_6$ are rendered conductive, whereby a predetermined current flows through the series circuit from Vcc—the resistor $R_1$—PMOST $Q_5$—NMOST $Q_3$—PMOST $Q_4$—NMOST $Q_6$—the resistor $R_2$—GND, and predetermined potentials are applied to connection points $N_{11}$ and $N_{21}$. Here, the resistors $R_1$ and $R_2$ having high resistances are inserted to decrease the current consumed by the series circuit at the time when the constant voltage is supplied from the connection point $N_1$ to the circuit 12 that uses the constant voltage. If the levels at the connection points $N_{11}$ and $N_{21}$ are denoted by $V_{11}$ and $V_{21}$, then the following equation holds:

$$(V_{cc}-V_{11})/R_1 = V_{21}/R_2$$

Further, if the level of the output node $N_1$ is denoted by $V_1$, then there holds the following relation, $$V_1 = V_{11} - V_{TN} = V_{21} + V_{TP}$$

where $V_{TN}$ and $V_{TP}$ denote threshold voltages of the NMOST $Q_3$ and the PMOST $Q_4$.

From the above equation, the potential $V_1$ at the connection point $N_1$ is given by the following relation, $$V_1 = (R_2 \cdot V_{cc} + R_1 \cdot V_{TP} - R_2 V_{TN})/(R_1+R_2)$$

The circuit 10 supplies this potential as the constant voltage to the circuit 12.

Next, when the signal $\overline{\phi_0}$ assumes the H level during a reset period $T_R$, the NMOST $Q_7$ and the PMOST $Q_8$ are rendered conductive, while the PMOST $Q_5$ and the NMOST $Q_6$ are rendered nonconductive. Thus, the connecting point $N_{11}$ assumes ground level and the connection point $N_{21}$ assumes the power sourve Vcc level. Then, the NMOST $Q_1$ and the PMOST $Q_2$ are rendered nonconductive, and the connection point $N_1$ set at the high impedance state (floating condition). Under this condition, therefore, no current is consumed by the circuit 10.

When the signal $\overline{\phi_0}$ assumes the L level again, the PMOST $Q_5$ is rendered conductive, and a current is supplied from Vcc via the resistor $R_1$, to the connection point $N_{11}$ that is assuming the ground level. Therefore, the potential rises at the connection point $N_{11}$. Similarly, the NMOST $Q_6$ is rendered conductive, and the level at the point $N_{21}$ drops down to the ground potential via the resistor $R_2$. After a predetermined period $T_d$ of time has passed, the aforementioned levels $V_{11}$ and $V_{21}$ are assumed, and the intermediate level $V_1$ is supplied to the circuit 12.

In the above-mentioned conventional constant voltage generating circuit, the connection points $N_{11}$ and $N_{21}$ are charged and discharged via resistances of $R_1$ and $R_2$ when the reset non-feeding condition of constant voltage is to be shifted to the enabled, feeding condition, and the steady condition is assumed. However, since the resistances of $R_1$ and $R_2$ are large to reduce the electric power consumed in the circuit 10, an extended period of time ($T_d$) is required before the potentials at the connection points $N_{11}$ and $N_{21}$ are stabilized and the output $V_1$ becomes unstable during this period $T_d$. Therefore, the conventional circuit cannot quickly meet the request for obtaining the constant voltage.

Figure 3:
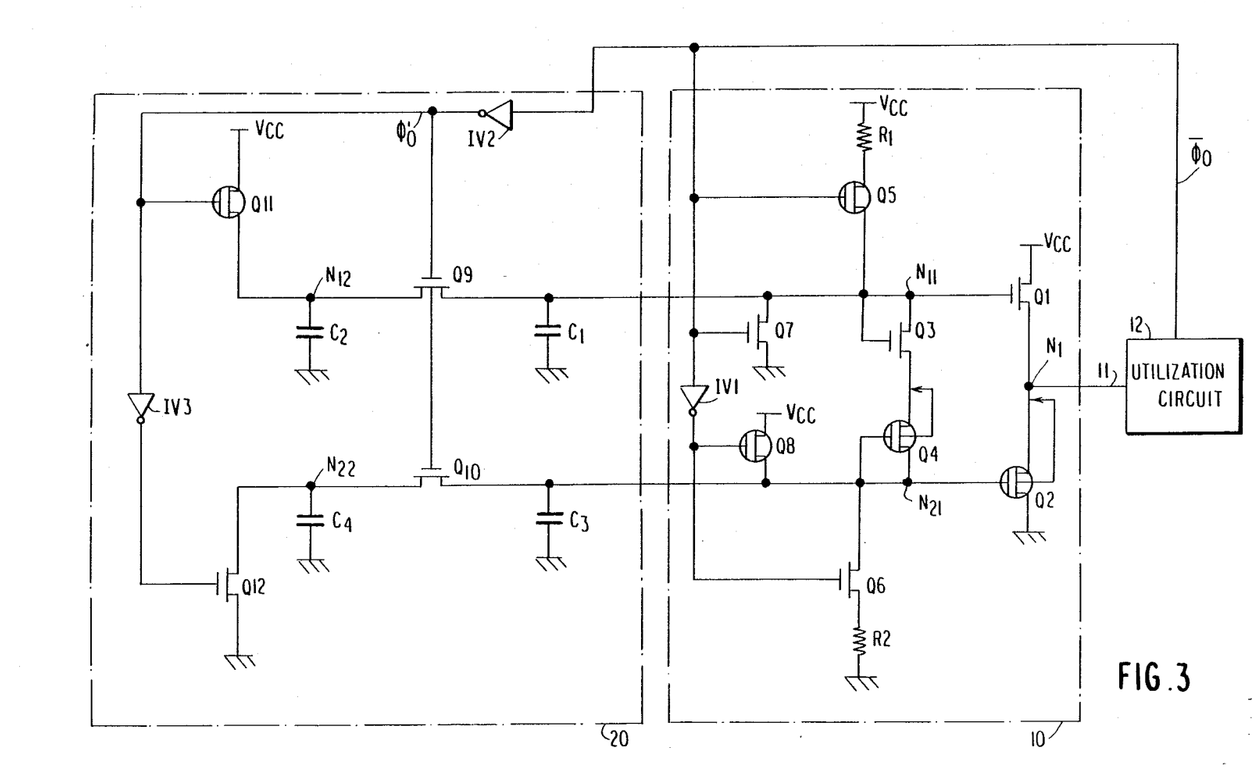
FIG. 3 is a schematic circuit diagram showing a constant voltage generating circuit according to one embodiment of the present invention.
Figure 4:
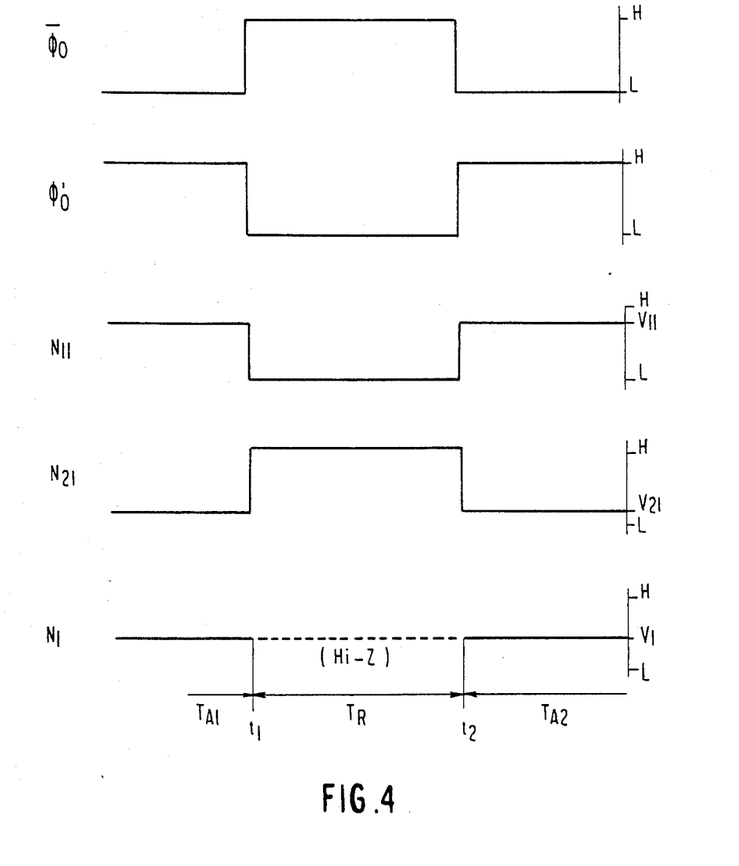
FIG. 4 is a timing chart showing the operation of the circuit of FIG. 3.

With reference to FIGS. 3 and 4, the constant voltage generating circuit according to one embodiment will be explained.

In FIG. 3, the elements or portions corresponding to those in FIG. 1 are denoted by the same or similar references and detailed explanation thereof will be omitted.

The constant voltage generating circuit according to this embodiment is featured by a charge control circuit 20 in addition to the conventional circuit portion 10. The charge control circuit 20 includes capacitors $C_1$, $C_2$, $C_3$, $C_4$, NMOSTs $Q_9$, $Q_{10}$, $Q_{11}$, a PMOST $Q_{11}$, and inverters $IV_2$ and $IV_3$.

With reference to FIG. 4, the operation of the circuit of FIG. 3 will be explained.

During a first active period $TA_1$ prior to a time point $t_1$, the request from the utilization circuit 12 assumes the active, L level and its inverted signal $\phi_0'$ by the inverter $IV_2$ is at the H level. Therefore, the NMOSTs $Q_9$ and $Q_{10}$ are rendered conductive and the PMOST $Q_{11}$ and the NMOST $Q_{12}$ are rendered nonconductive. Thus, the connection points $N_{11}$ and $N_{22}$ assume a potential equal to $V_{12}$ and the connection points $N_{21}$ and $N_{22}$ assume a potential equal to $V_{22}$.

Next, during a reset period $T_R$ from $t_1$ to $t_2$ when $\overline{\phi_0}$ has the H level, and the NMOS $Q_1$ and PMOST $Q_2$ are nonconductive to set $N_1$ at the high impedance state (Hi-z). Also, the signal $\phi_0'$ assumes the L level and the NMOSTs $Q_9$ and $Q_{10}$ are rendered non-conductive, so that the connection points $N_{11}$ and $N_{12}$ and the connection points $N_{21}$ and $N_{22}$ are isolated from each other. At this moment, as described with reference to the prior art, the NMOST $Q_7$ and the PMOST $Q_8$ are rendered conductive so that the connection point $N_{11}$ assumes the ground level and the connection point $N_{21}$ assumes the Vcc level. The PMOST $Q_{11}$ and NMOST $Q_{12}$ are rendered conductive, too, and the connection point $N_{12}$ assumes the Vcc level and the connection point $N_{22}$ assumes the ground level. Here, if the amounts of electric charges stored in the capacitors $C_2$ and $C_3$ are denoted by $Q_2$ and $Q_3$, and potentials at the consumption points $N_{12}$ and $N_{21}$ are denoted by $V_{12}$ and $V_{21}$, then there hold the following relation, $$Q_2 = C_2 \cdot V_{12} = C_2 \cdot V_{cc}$$

$$Q_3 = C_3 \cdot V_{21} = C_3 \cdot V_{cc}$$

Next, when the condition is changed to a second active period $TA_2$ from $t_2$ and $\overline{\phi_0}$ is changed to the L level again, the PMOSTs $Q_8$, $Q_{11}$ and the NMOSTs $Q_7$, $Q_{12}$ are rendered non-conductive. When the NMOSTs $Q_9$ and $Q_{10}$ are rendered conductive, the potential at the connection point $N_{11}$ approaches that of the point $N_{12}$ and the potential at the connection point $N_{21}$ approaches that of the point $N_{22}$ as the electric charges move from $C_2$ to $C_1$ and from $C_3$ to $C_4$. At this moment, if a resultant potential at the nodes $N_{11}$ and $N_{12}$ is denoted by $V_{11}'$ and a resultant potential at the nodes $N_{21}$ and $N_{22}$ is denoted by $V_{21}'$ then the following relations hold true from the law of conservation of electric charge, i.e., $$(C_1 + C_2) V_{11}' = C_2 V_{cc}$$

$$(C_3 + C_4) V_{21}' = C_3 V_{cc}$$

Therefore, $$V_{11}' = C_1 V_{cc}/(C_1 + C_2)$$

$$V_{21}' = C_3 V_{cc}/(C_3 + C_4)$$

Thus, levels at the connection points $N_{11}$ and $N_{12}$ can be determined instantaneously depending upon the ratios of capacitances of the capacitors $C_1$, $C_2$ and the capacitors $C_3$, $C_4$. By adjusting the capacitances of $C_1$–$C_4$, therefore, the potentials can be brought to the levels at the connection points $N_{11}$ and $N_{12}$ determined by the ratio of the resistances $R_1$ and $R_2$. That is, referring to FIG. 4, when the request signal $\overline{\phi_0}$ is produced, the potentials at the connection points $N_{11}$ and $N_{21}$ readily reach their stable points and, accordingly, the potential at the output $N_1$ readily arrives at its specified level $V_1$.

Figure 5:
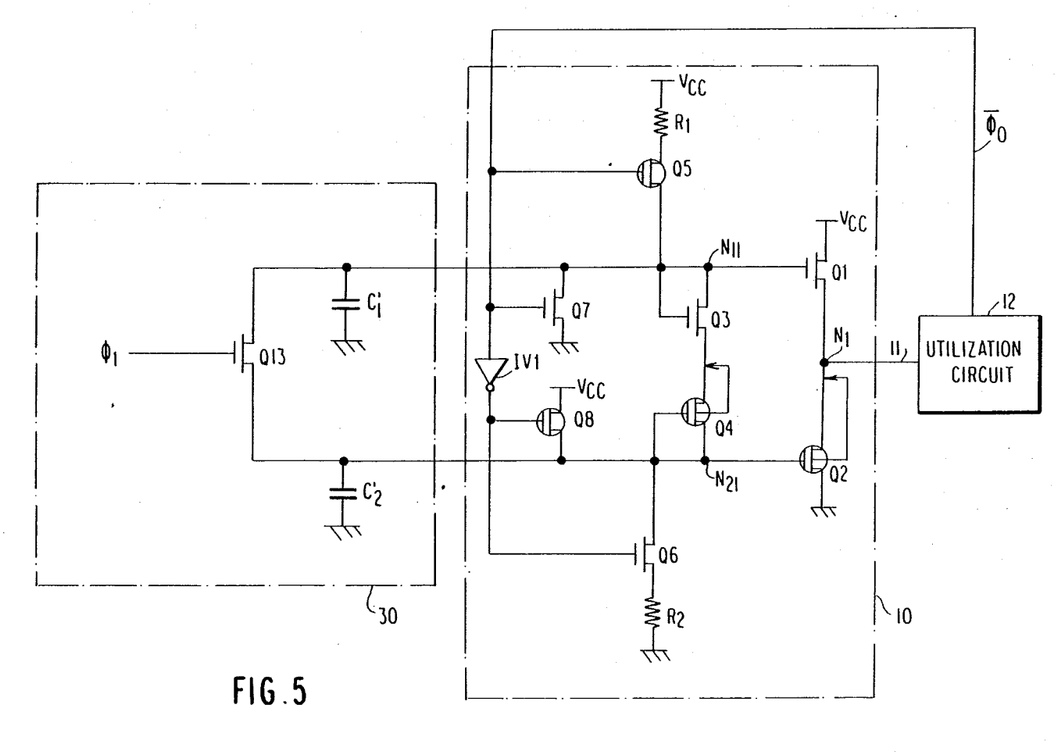
FIG. 5 is a schematic circuit diagram of a constant voltage generating circuit according to another embodiment of the present invention.
Figure 6:
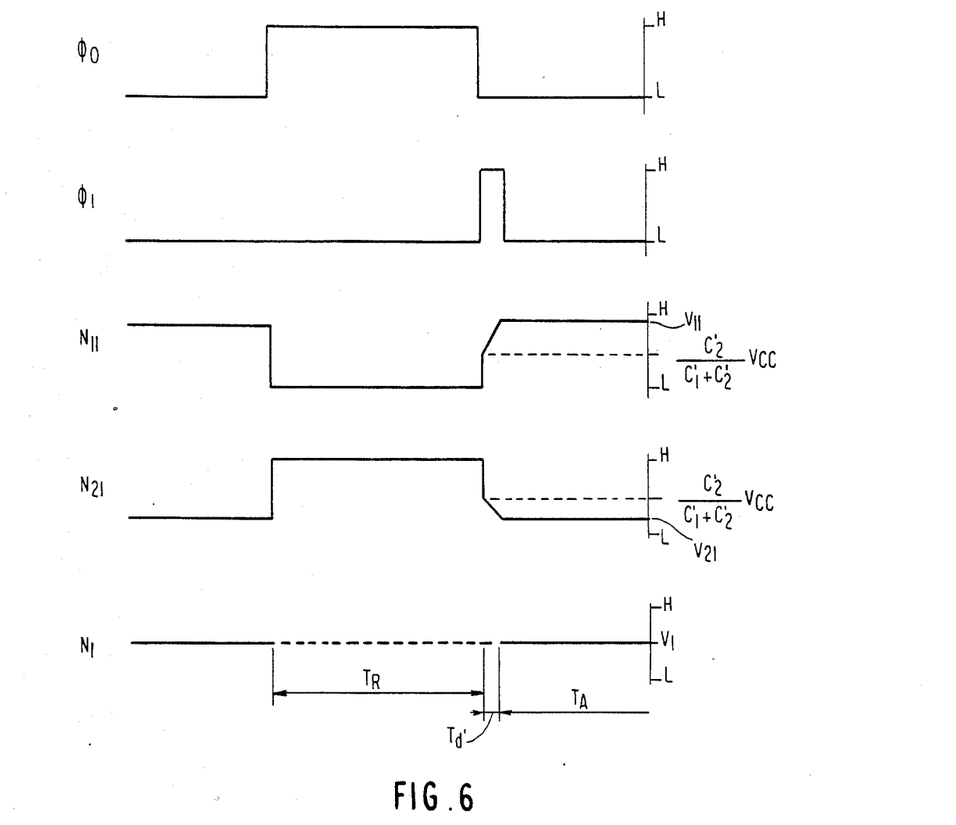
FIG. 6 is a timing chart showing the operation of the circuit of FIG. 5.

FIG. 5 shows the constant voltage generating circuit according to another embodiment of the present invention. A charge control circuit 30 is formed by smaller number of elements than those of the circuit 20 of FIG. 3, and is controlled by a control signal $\phi_1$. FIG. 6 illustrates waveforms of control signals and levels at the internal connection points. The control signal $\phi_1$ is a one-shot signal that is activated only when $\overline{\phi_0}$ changes from H into L during $T_d'$. So far as $\overline{\phi_1}$ remains at the L level, an NMOST $Q_{13}$ remains nonconductive. Therefore, so far as $\overline{\phi_0}$ remains at the H level during $T_R$, terminals of the capacitors $C_1'$, $C_2'$ on the side of the connection points $N_{11}$, $N_{21}$ assume the ground level and the power source level Vcc, respectively. If now, $\overline{\phi_0}$ changes from H to L and $\phi_1$ assumes the H level during $T_d'$ whereby the NMOST $Q_{13}$ is rendered conductive to give a level $V_{13}$ expressed by the following equation to the connection points $N_{11}$ and $N_{21}$, $$V_{13} = C_2' V_{cc}/(C_1' + C_2')$$

Then, the signal $\phi_1$ readily assumes the L level and the NMOST $Q_{13}$ is rendered non-conductive.

Thus, the level $V_{13}$ determined by the ratio of capacitances of the capacitors $C_1'$, $C_2'$ reaches the specified levels $V_{11}$ and $V_{21}$ through $R_1$ and $R_2$ within a very short period $T_d'$ of time compared with that of the prior art. This embodiment is advantageous in that the control circuit constituted by a decreased number of elements supplies a constant voltage to the circuit 12 at a high speed.

Though ends on one side of the capacitors were grounded in the above-mentioned embodiments, they need not necessarily be connected in a manner as described above but may suitably be connected to the power source terminal $V_{cc}$ in accordance with the present invention.

According to the present invention as described above, capacitors are connected to connection points to where are connected gates of two transistors that supply an intermediate level of constant voltage, and charge and discharge of electric charge to and from the capacitors are controlled at a moment when the constant voltage is requested. Therefore, the constant voltage of a stable level can be quickly supplied to the circuit without increasing the consumption of electric power by the circuit.

What is claimed is:

1. A voltage generating circuit comprising first and second voltage terminals receiving first and second voltages, respectively; an output terminal; a first field effect transistor having a source-drain path connected between said first voltage terminal and said output terminal and a gate coupled to a first node; a first series circuit having a first resistor and a first switch element connected in series between said first voltage terminal and said first node; means for connecting said first node and said second voltage terminal; means for receiving a control signal assuming one of first and second levels, a first control circuit coupled to said first switch element for rendering said first switch element conductive thereby to generate a first bias voltage at said first node by causing a current flowing through said first series circuit and said impedance circuit in response to said first level of said control signal and non-conductive in response to said second level of said control signal, said first transistor being rendered conductive in response to said first bias voltage at said first node thereby to generate a constant voltage at said output terminal; a second control circuit coupled to said first node for operatively setting said first node at a second bias voltage in response to said second level of said control signal, said first transistor being rendered non-conductive in response to said second bias voltage at said first node; first and second capacitors each having first and second ends; means for connecting the second end of said first capacitor to one of said first and second voltage terminals; means for connecting the second end of said second capacitor to one of said first and second voltage terminals; a first charge circuit coupled to said first capacitor for operatively charging the first end of said first capacitor to said second voltage in response to said second level of said control signal; a second charge circuit coupled to said second capacitor for operatively charging the first end of said second capacitor to said first voltage in response to said second level of said control signal; a first charge control circuit for operatively short-circuiting the first ends of said first and second capacitors thereby to generate a first equilibrium voltage having a value close to said first bias voltage in response to said first level of said control signal; and means for applying said first equilibrium voltage to said first node.

2. The voltage generating circuit according to claim 1, further comprising a second field effect transistor having a source-drain path connected between said output terminal and said second voltage terminal and a gate connected to a second node.

3. The constant voltage generating circuit according to claim 2, in which said impedance circuit includes a second series circuit of a second resistor and a second switch element connected in series between said second node and said second voltage terminal; a third control circuit for rendering said second switch element conductive thereby to set said second node at a third bias voltage that makes said second transistor conductive in response to said first level of said control signal and non-conductive in response to said second level of said control signal; and a fourth control circuit coupled to said second node for operatively setting said second node at a fourth bias voltage that makes said second transistor non-conductive in response to said second level of said control signal.

4. The voltage generating circuit according to claim 3, further comprising third and fourth capacitors each having first and second ends; means for connecting the second end of said third capacitor to one of said first and second voltage terminals; means for connecting the second end of said fourth capacitor to one of said first and second voltage terminal; a third charge control circuit for operatively charging the first end of said third capacitor to said first voltage in response to said second level of said control signal; a fourth charge control circuit for operatively charging the second end of said fourth capacitor to said second voltage in response to said second level of said control signal; a second charge control circuit for operatively short-circuiting the first ends of said third and fourth capacitors thereby to generate a second equilibrium voltage having a value close to said third bias voltage in response to said first level of said control signal; and means for applying said second equilibrium voltage to said second node.

5. A constant voltage generating circuit comprising first and second voltage terminals for receiving first and second voltages, respectively; an output terminal; a first field effect transistor having a source-drain path connected between said first voltage terminal and said output terminal and a gate connected to a first node; a second field effect transistor having a source-drain path connected between said output terminal and said second voltage terminal and a gate connected to a second node; a first series circuit of a first resistor and a first switch element connected in series between said first voltage terminal and said first node; a second series circuit of a second resistor and a second switch element connected in series between said second node and said second voltage terminal; a impedance circuit connected between said first and second node; means for receiving a control signal assuming one of first and second levels; a first control circuit coupled to said first and second switch elements for rendering said first and second switch elements conductive thereby to cause a current flowing through said first series circuit, said impedance circuit and said second series circuit as that said first and second nodes are biased for making said first and second transistors conductive in response to said first level of said control signal, and non-conductive in response to said second level of said control signal; a second control circuit coupled to said first and second nodes for biasing said first and second nodes for making said first and second transistors non-conductive in response to said second level of said control signal; first and second capacitors; a first charge circuit coupled to one end of said first capacitor for charging the one end of said first capacitor to said second voltage in response to said second level of said control signal; a second charge circuit coupled to one end of said capacitor for charging the one end of said second capacitor to said first voltage in response to said second level of said control signal; and a first charge control circuit coupled to the one ends of said first and second capacitors, said first charge control circuit operatively generating a first equilibrium voltage by short-circuiting the one ends of said first and second capacitors in response to said first level of said control signal; and means for applying said equilibrium voltage to said first node.

6. The constant voltage generating circuit according to claim 5, further comprising third and fourth capacitors; a third charge circuit coupled to one end of said third capacitor to charge the one end of said third capacitor to said second voltage in response to said second level of said control signal; a fourth charge circuit coupled to one end of said fourth capacitor to charge the one end of said fourth capacitor to said first voltage in response to said second level of said control signal; a second charge control circuit coupled to the one ends of said third and fourth capacitors for generating a second equilibrium voltage by short-circuiting the one ends of said third and fourth capacitors in response to said first level of said control; and means for applying said second equilibrium voltage to said second node.

7. The constant voltage generating circuit according to claim 5, further comprising means for applying said first equilibrium voltage to said second node.

* * * * *

UNITED STATES PATENT AND TRADEMARK OFFICE
CERTIFICATE OF CORRECTION

PATENT NO. : 4,933,627
DATED : June 12, 1990
INVENTOR(S) : Hara

It is certified that error appears in the above-identified patent and that said Letters Patent is hereby corrected as shown below:

Col. 2, line 36, delete "i" and insert --in--.

Col. 4, line 13, delete "sourve" and insert --source--.

Col. 4, line 58 after "request" insert --signal $\overline{\phi}$--.

Signed and Sealed this

Twentieth Day of August, 1991

Attest:

HARRY F. MANBECK, JR.

*Attesting Officer*  *Commissioner of Patents and Trademarks*